US011264276B2

(12) United States Patent
Chen et al.

(10) Patent No.: US 11,264,276 B2
(45) Date of Patent: Mar. 1, 2022

(54) INTERCONNECT INTEGRATION SCHEME WITH FULLY SELF-ALIGNED VIAS

(71) Applicant: INTERNATIONAL BUSINESS MACHINES CORPORATION, Armonk, NY (US)

(72) Inventors: Shyng-Tsong Chen, Rensselaer, NY (US); Terry A. Spooner, Mechanicville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/659,734

(22) Filed: Oct. 22, 2019

(65) Prior Publication Data

US 2021/0118733 A1    Apr. 22, 2021

(51) Int. Cl.
*H01L 21/768* (2006.01)
*H01L 23/528* (2006.01)
*H01L 23/522* (2006.01)

(52) U.S. Cl.
CPC .. *H01L 21/76897* (2013.01); *H01L 21/76807* (2013.01); *H01L 21/76877* (2013.01); *H01L 23/528* (2013.01); *H01L 23/5226* (2013.01)

(58) Field of Classification Search
CPC ........... H01L 21/76897; H01L 23/5221; H01L 21/76807; H01L 23/5226; H01L 21/76877; H01L 23/528
See application file for complete search history.

(56) References Cited

U.S. PATENT DOCUMENTS

| 6,087,251 A | * | 7/2000 | Hsu | .................. | H01L 21/76883 |
| | | | | | 438/618 |
| 8,105,867 B2 | | 1/2012 | Matamis et al. | | |

(Continued)

FOREIGN PATENT DOCUMENTS

| WO | 2015047321 A1 | 4/2015 |
| WO | 2017165206 A1 | 9/2017 |

OTHER PUBLICATIONS

Tetsuya Homma, Low dielectric constant materials and methods for interlayer dielectric films in ultralarge-scale integrated circuit multilevel interconnections, Materials Science and Engineering. R23 (1998) 243-285 (Year: 1998).*

(Continued)

*Primary Examiner* — Shih Tsun A Chou
(74) *Attorney, Agent, or Firm* — Tutunjian & Bitetto, P.C.; L. Jeffrey Kelly (57) ABSTRACT

A method is presented for forming self-aligned vias by employing a top level line pattern. The method includes forming first conductive lines within a first dielectric material, recessing one conductive line of the conductive lines to define a first opening, filling the first opening with a second dielectric material, and forming a sacrificial block perpendicular to and in direct contact with a non-recessed first conductive line. The method further includes forming a single via directly underneath the sacrificial block by recessing the non-recessed first conductive line, removing the sacrificial block to define a second opening, and filling the second opening with a conductive material to define a second conductive line such that the single via aligns to both the non-recessed first conductive line and the second conductive line.

16 Claims, 6 Drawing Sheets

(56) References Cited

U.S. PATENT DOCUMENTS

| | | |
|---|---|---|
| 9,041,217 B1 | 5/2015 | Bristol et al. |
| 9,236,342 B2 | 1/2016 | Bristol et al. |
| 9,324,650 B2 | 4/2016 | Edelstein et al. |
| 9,607,893 B1 | 3/2017 | Zhang et al. |
| 9,953,865 B1 | 4/2018 | riggs et al. |
| 9,966,337 B1 | 5/2018 | Briggs et al. |
| 10,177,028 B1 | 1/2019 | LiCausi et al. |
| 2001/0055872 A1* | 12/2001 | Fukazawa ......... H01L 21/76838 438/622 |
| 2016/0204002 A1 | 7/2016 | Wallace et al. |
| 2017/0263553 A1 | 9/2017 | Schenker et al. |
| 2018/0040510 A1 | 2/2018 | Briggs et al. |
| 2018/0040631 A1* | 2/2018 | Kim ..................... H01L 29/785 |

OTHER PUBLICATIONS

Briggs et al., "Fully Aligned Via Integration for Extendibility of Interconnects to Beyond the 7 nm Node", 2017 IEEE International Electron Devices Meeting (IEDM). Dec. 2, 2017. pp. 1-4.

Anonymous, "bi-directionally self aligned vias", IP.com Prior Art database Technical Disclosure. IP.com No. IPCOM000231097D. Sep. 26, 2013. pp. 1-6.

* cited by examiner

INTERCONNECT INTEGRATION SCHEME
WITH FULLY SELF-ALIGNED VIAS

BACKGROUND

The present invention relates generally to semiconductor devices, and more specifically, to interconnect integration schemes with fully self-aligned vias.

As process dimensions continue to shrink, multi-step litho-etch patterning for semiconductor devices is usually needed to print 64 nanometer (nm) pitch metal layers (Mx levels) or below. However, poor overlay can be a significant factor for consideration in successful patterning applications. For example, without self-aligned via (SAV) processes, the dielectric space between copper lines and vias can become small, which can cause reliability issues.

SUMMARY

In accordance with an embodiment, a method is provided for forming self-aligned vias by employing a top level line pattern. The method includes forming first conductive lines within a first dielectric material, recessing one conductive line of the first conductive lines to define a first opening, filling the first opening with a second dielectric material, and forming a sacrificial block perpendicular to and in direct contact with a non-recessed first conductive line. The method further includes forming a single via directly underneath the sacrificial block by recessing the non-recessed first conductive line, removing the sacrificial block to define a second opening, and filling the second opening with a conductive material to define a second conductive line such that the single via aligns to both the non-recessed first conductive line and the second conductive line.

In accordance with another embodiment, a method is provided for forming self-aligned vias by employing a top level line pattern. The method includes forming first conductive lines within a first dielectric material, depositing a block mask over one of the first conductive lines, recessing an exposed first conductive line to define a first gap, removing the block mask, and filling the first gap with a second dielectric material. The method further includes depositing a sacrificial block, recessing another exposed conductive line to define a second gap and a single via, filling the second gap with a third dielectric material, removing the sacrificial block to define a third gap, and filling the third gap with a conductive material to define a second conductive line such that the single via aligns to both the first conductive lines and the second conductive line.

In accordance with yet another embodiment, a semiconductor device is provided for forming self-aligned vias by employing a top level line pattern. The semiconductor device includes first conductive lines disposed within a first dielectric material, a second conductive line disposed perpendicular to the first conductive lines, and a single via disposed directly between the first conductive lines and the second conductive line, wherein the single via is aligned to both the first conductive lines and the second conductive line.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for employing a top line pattern to form vias between top and bottom conductive lines such that the vias can be fully aligned to both top and bottom conductive lines. With the 7 nm technology node in the development phase and the 5 nm node moving into development, transistor scaling gets ever more complex. On top of that, performance benefits gained at the front-end-of-line (e.g., the transistors) can easily be undone if similar improvements are not made in the back-end-of-the-line (BEOL). BEOL processing involves the creation of stacked layers of metal wires that electrically interconnect transistors in a chip. With each technology node, this metal wiring scheme becomes more complex, mainly because there are more transistors to connect with an ever tighter pitch. Shrinking dimensions also means the wires have a reduced cross-sectional area, which drives up the resistance-capacitance product (RC) of the interconnect system.

Metal-based dual damascene has been the workhorse process flow for interconnects. The metal can be, e.g., copper (Cu). A simple dual damascene flow starts with deposition of a low-k dielectric material on a structure. These low-k films are designed to reduce the capacitance and the delay in the integrated circuits (ICs). In a next step, this dielectric layer is covered with an oxide and a resist, and vias and trenches are formed using lithography and etch steps. These vias connect one metal layer with the layer above or below. Then, a metallic barrier layer is added to prevent metal atoms from migrating into the low-k materials. The barrier layers are deposited with, e.g., physical vapor deposition (PVD), using materials such as, e.g., tantalum and tantalum nitride. In a final step, this structure is seeded, electroplated with a metal (usually Cu), followed by a chemical mechanical planarization (CMP) step. However, such conventional FAV schemes can result in chip yield and reliability issues.

Embodiments in accordance with the present invention provide methods and devices for constructing self-aligned vias by employing a top level line pattern, which can significantly reduce or eliminate chip yield and reliability issues. The via level litho process is skipped in the integration scheme. The self-aligned vias are constructed by using a sacrificial line pattern to form the vias, and then convert the sacrificial line patterns into metal line patterns. As a result, the vias are fully aligned to the top level and bottom level conductive or metal lines. Additionally, the exemplary embodiments of the present invention eliminate line-to-via litho alignment errors, minimize contact resistance, maximize via current, and improve via reliability.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
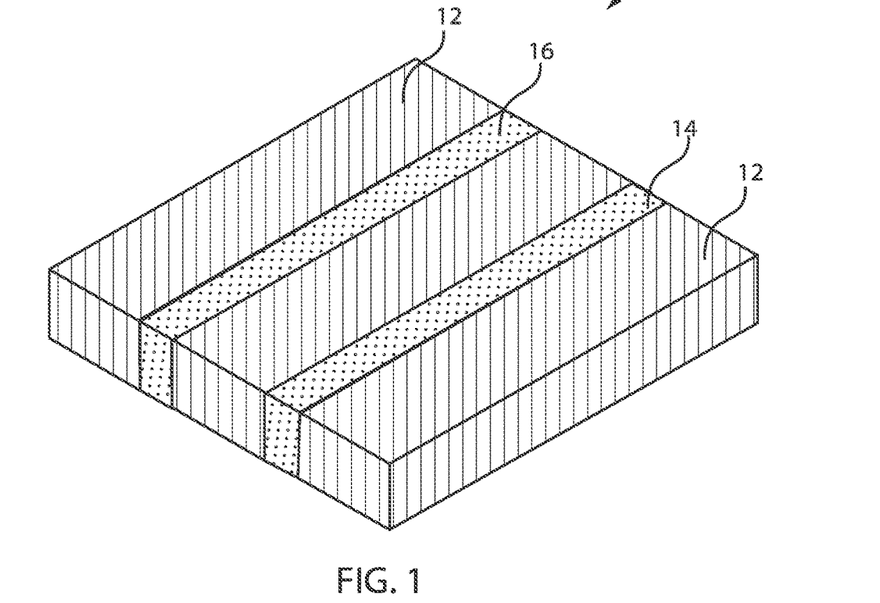
FIG. 1 is a perspective view of a semiconductor structure including first conductive lines formed within a dielectric layer, in accordance with an embodiment of the present invention.

FIG. 1 is a perspective view of a semiconductor structure including first conductive lines formed within a dielectric layer, in accordance with an embodiment of the present invention.

In various example embodiments, the semiconductor structure 5 includes a plurality of first conductive lines formed in a dielectric material 12. In one instance, a first conductive line 14 and a second conductive line 16 can be formed extending from one end (proximal most end) of the dielectric material 12 to the other end (distal most end) of the dielectric material 12. The conductive lines 14, 16 can be configured to be parallel to each other. The conductive lines 14, 16 can be configured to have a substantially equal width. The conductive lines 14, 16 can be configured to extend from a topmost portion to a bottommost portion of the dielectric material 12. The plurality of conductive lines 14, 16 can be metal lines.

The dielectric material 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

Alternatively, dielectric material 12 can include any interlayer dielectric such as but not limited to: silicon nitride ($Si_3N_4$), silicon oxide ($SiO_2$), fluorinated $SiO_2$ (FSG), and low k dielectrics like hydrogenated silicon oxycarbide (SiCOH), porous SiCOH, boro-phospho-silicate glass (BPSG), silsesquioxanes, carbon (C) doped oxides (e.g., organosilicates) that include atoms of silicon (Si), carbon (C), oxygen (O), and/or hydrogen (H) and nitrogen (N), thermosetting polyarylene ethers, a spin-on silicon-carbon containing polymer material, other ultra-low k (ULK) based on SiCOH with low dielectric constant (k<2.7) material, or layers thereof. The precise thickness of dielectric material 12 can vary widely with the intended application.

The plurality of conductive lines 14, 16 can be formed in openings or trenches formed in the dielectric material 12. The conductive lines 14, 16 can be any conductive materials known in the art, such as, for example, copper (Cu), aluminum (Al), ruthenium (Ru), Cobalt (Co), rhodium (Rh) or tungsten (W). The conductive lines 14, 16 can be fabricated using any technique known in the art, such as, for example, a single or dual damascene technique.

Figure 2:
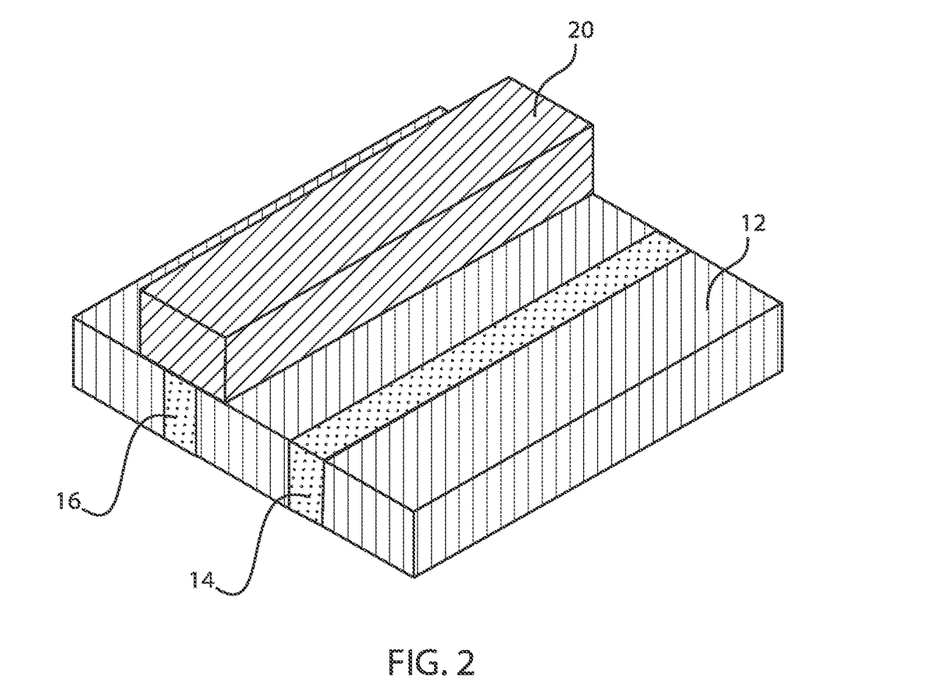
FIG. 2 is a perspective view of the semiconductor structure of FIG. 1 where a block mask is deposited over one conductive line, in accordance with an embodiment of the present invention.

FIG. 2 is a perspective view of the semiconductor structure of FIG. 1 where a block mask is deposited over one conductive line, in accordance with an embodiment of the present invention.

In various example embodiments, a block mask 20 is deposited over one of the conductive or metal lines. In one instance, the block mask 20 is deposited over conductive line 16. The block mask 20 extends from the proximal most end of the dielectric material 12 to the distal most end of the dielectric material 12. The block mask 20 covers the entirety of a top surface of the conductive line 16. The block mask 20 directly contacts conductive lines which will have vias subsequently formed over or on top of it. It is noted that no block mask is formed over conductive line 14. Thus, a top surface of conductive line 14 remains exposed.

The block mask 20 can include a dielectric oxide or dielectric nitride. In one embodiment, the block mask 20 includes silicon dioxide. The block mask 20 can be formed, for example, by chemical vapor deposition (CVD), Plasma Enhanced CVD (PECVD) or atomic layer deposition (ALD). The thickness of the block mask 20 can be from about 10 nm to about 50 nm, although lesser and greater thicknesses can also be employed.

In another example, the block mask 20 can include a photosensitive material deposited using known methods (e.g., a spin coating process) followed by photolithography. The block mask 20 can be, for example, a nitride hardmask. Alternatively, the block mask 20 can include a hardmask layer such as amorphous carbon.

Figure 3:
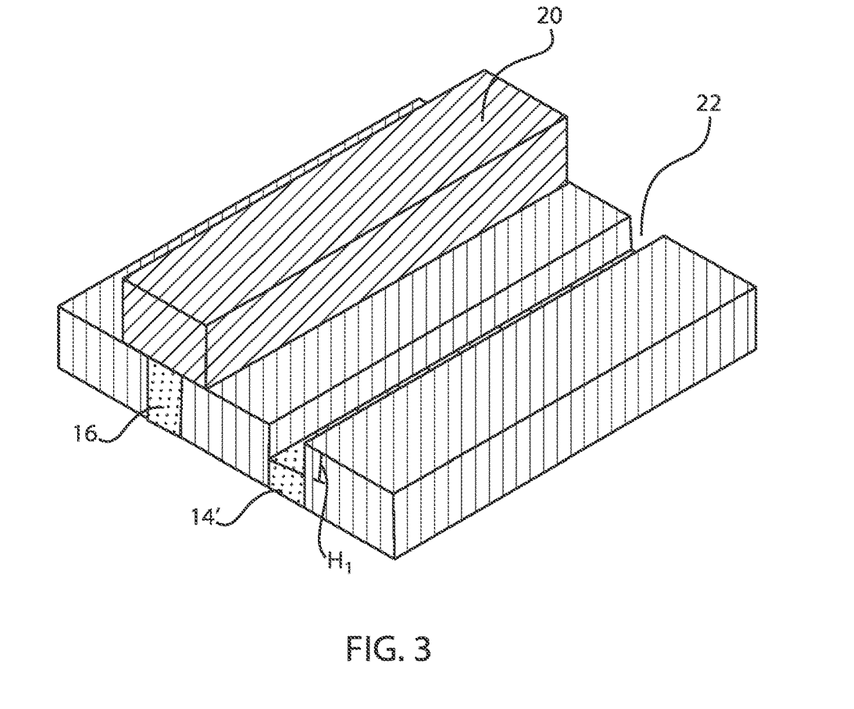
FIG. 3 is a perspective view of the semiconductor structure of FIG. 2 where the exposed conductive lines are recessed, in accordance with an embodiment of the present invention.

FIG. 3 is a perspective view of the semiconductor structure of FIG. 2 where the exposed conductive lines are recessed, in accordance with an embodiment of the present invention.

In various example embodiments, the unblocked conductive lines are recessed. For example, the conductive line 14 is recessed by a height "$H_1$." This results in remaining conductive line 14'. In one instance, the recess can be approximately half the height of the dielectric material 12. The recess of conductive line 14 creates a gap or opening 22 over the remaining conductive line 14'. The recess 22 does not affect the dielectric material 12 and the block mask 20.

The conductive line 14 can be etched by, for example, employing a reactive ion etch (RIE) process or a halogen-based chemical etch process (e.g., including chlorine-containing gas and/or fluorine-containing gas chemistry).

In general, regarding the etching of any materials, such materials can be removed by a dry etching process, for example, ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide.

Figure 4:
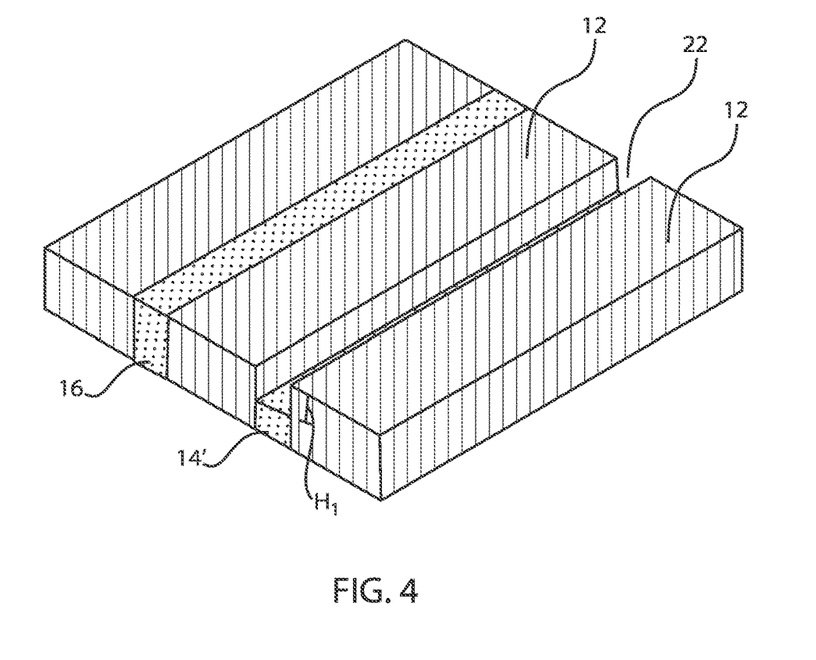
FIG. 4 is a perspective of the semiconductor structure of FIG. 3 where the block mask is stripped to expose all of the first conductive lines (recessed and non-recessed), in accordance with an embodiment of the present invention.

FIG. 4 is a perspective of the semiconductor structure of FIG. 3 where the block mask is stripped to expose all of the first conductive lines (recessed and non-recessed), in accordance with an embodiment of the present invention.

In various example embodiments, the block mask 20 is stripped. The etch can, for example, include a wet etch such as a phosphoric acid ($H_3PO_4$) (wet chemistry) etch or a diluted hydrogen fluoride (HF) etch. The stripping of the block mask 20 results in exposure of a top surface of the conductive line 16. The remaining conductive line 14' remains intact.

Figure 5:
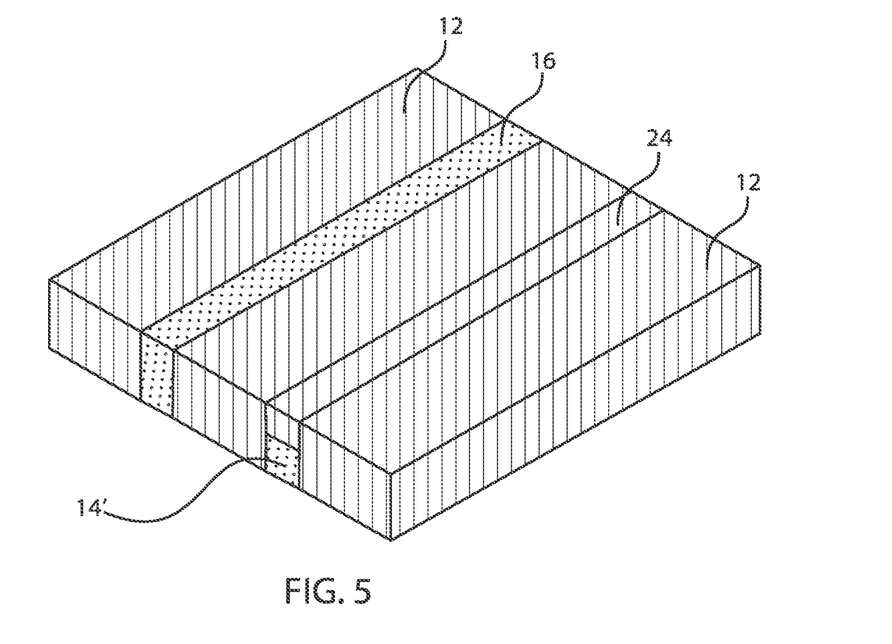
FIG. 5 is a perspective view of the semiconductor structure of FIG. 4 where a dielectric material is deposited over the recessed conductive lines, in accordance with an embodiment of the present invention.

FIG. 5 is a perspective view of the semiconductor structure of FIG. 4 where a dielectric material is deposited over the recessed conductive lines, in accordance with an embodiment of the present invention.

In various example embodiments, the recessed portion is backfilled with dielectric material 24. In one example, the dielectric material 24 can be the same material as dielectric material 12. The backfill results in covering the remaining conductive line 14'. Thus, only a top surface of conductive line 16 remains exposed.

Figure 6:
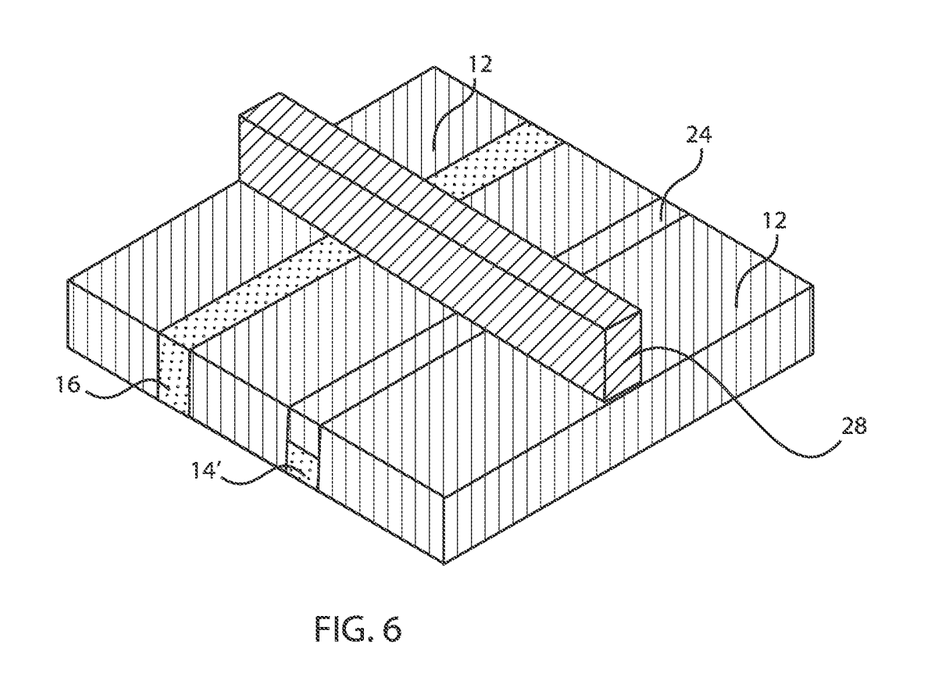
FIG. 6 is a perspective view of the semiconductor structure of FIG. 5 where a sacrificial block is deposited, in accordance with an embodiment of the present invention.

FIG. 6 is a perspective view of the semiconductor structure of FIG. 5 where a sacrificial block is deposited, in accordance with an embodiment of the present invention.

In various example embodiments, a sacrificial material 28 is deposited.

The sacrificial material 28 can be, e.g., amorphous conformal carbon or an amorphous silicon material or silicon nitride. The sacrificial material 28 can be referred to as a single sacrificial block 28. Sacrificial block 28 can be configured to be perpendicular to the conductive lines 14', 16. The sacrificial block 28 directly contacts a portion of the top surface of the conductive line 16. The sacrificial block 28 extends along an entire length of the dielectric material 12.

Figure 7:
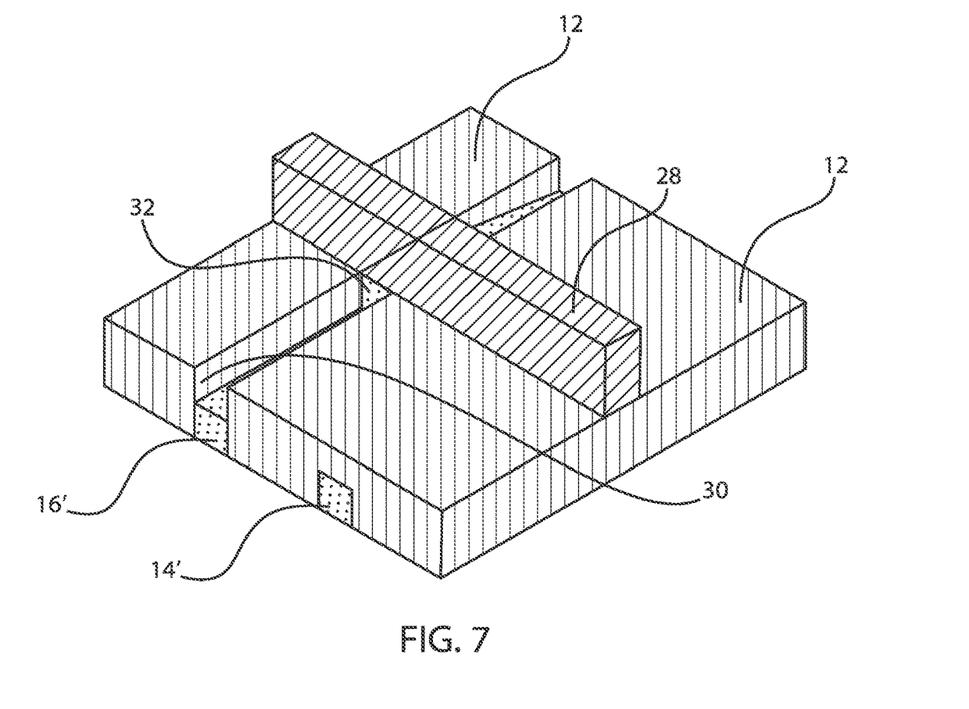
FIG. 7 is a perspective view of the semiconductor structure of FIG. 6 where the exposed conductive lines are recessed to form a single via, in accordance with an embodiment of the present invention.

FIG. 7 is a perspective view of the semiconductor structure of FIG. 6 where the exposed conductive lines are recessed to form a single via, in accordance with an embodiment of the present invention.

In various example embodiments, the exposed portions or sections of the conductive line 16 are recessed to form via 32. The recess 30 results in remaining conductive line 16'. The via 32 directly contacts the sacrificial block 28. It is noted that a single via is formed.

Figure 8:
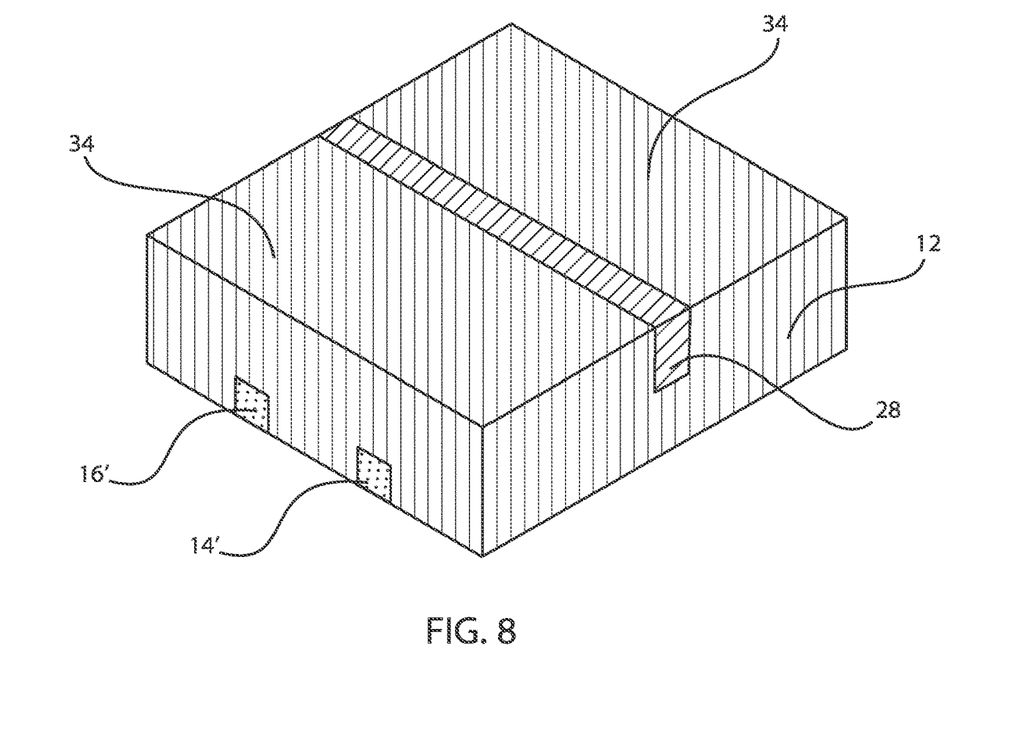
FIG. 8 is a perspective view of the semiconductor structure of FIG. 7 where another dielectric material is deposited over the recessed conductive lines, in accordance with an embodiment of the present invention.

FIG. 8 is a perspective view of the semiconductor structure of FIG. 7 where another dielectric material is deposited over the recessed conductive lines, in accordance with an embodiment of the present invention.

In various example embodiments, another dielectric material 34 is deposited over the recessed portions and over the sacrificial block 28. The dielectric material 34 can then be planarized by, e.g., CMP, such that a top surface of the sacrificial block 28 is exposed. The top surface of the dielectric material 34 is thus flush with a top surface of the sacrificial block 28. In one example, the dielectric material 34 can be the same material as the material for dielectric materials 12, 24.

Figure 9:
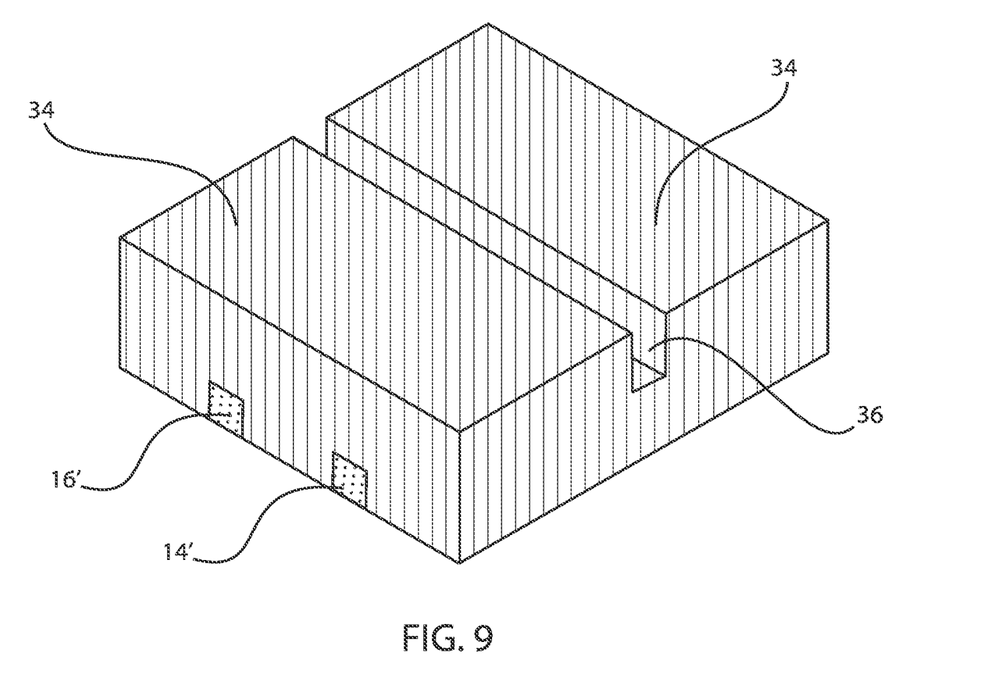
FIG. 9 is a perspective view of the semiconductor structure of FIG. 8 where the sacrificial block is removed, in accordance with an embodiment of the present invention.

FIG. 9 is a perspective view of the semiconductor structure of FIG. 8 where the sacrificial block is removed, in accordance with an embodiment of the present invention.

In various example embodiments, the sacrificial block 28 is removed, thus forming a gap or opening or trench 36. The gap 36 extends a length of the dielectric material 34. The gap 36 is formed perpendicular to the conductive lines 14', 16'. Also, the gap 36 extends an entire length of the dielectric material 12.

Figure 10:
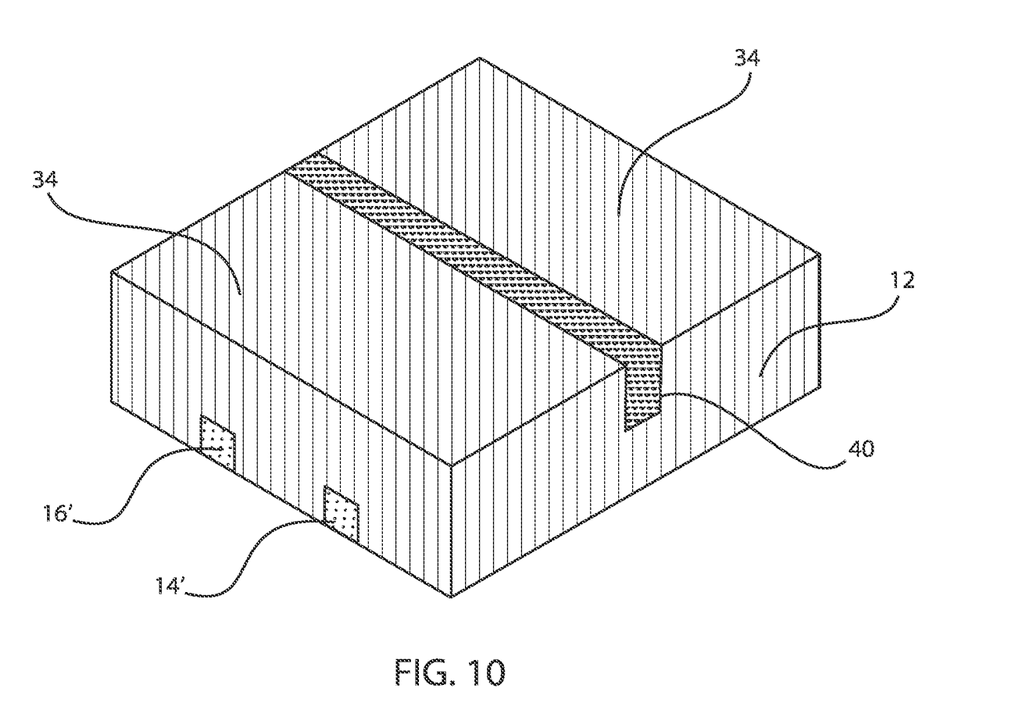
FIG. 10 is a perspective view of the semiconductor structure of FIG. 9 where a metal fill takes place, in accordance with an embodiment of the present invention.

FIG. 10 is a perspective view of the semiconductor structure of FIG. 9 where a metal fill takes place, in accordance with an embodiment of the present invention.

In various example embodiments, the gap 36 is filled with a conductive material 40. The conductive material 40 can be planarized by, e.g., CMP, such that a top surface of the conductive material 40 is flush with the top surface of the dielectric material 34. Thus, the strip of conductive material 40 is perpendicular to the conductive lines 14', 16' formed underneath.

The conductive material or conductive material strip 40 can be, e.g., Ta, Ti/TiN, W, WN, TaN, polysilicon, doped polysilicon, amorphous silicon, doped amorphous silicon, or any other suitable material, or any other conductive material. Alternatively, the conductive material 40 can be, e.g., any suitable conductive material or materials, e.g., Ag, Al, Cu, Ru, Co, Rh TaN, Ti, TiN, Al or any other suitable material, and can be deposited or formed in any suitable manner.

Figure 11:
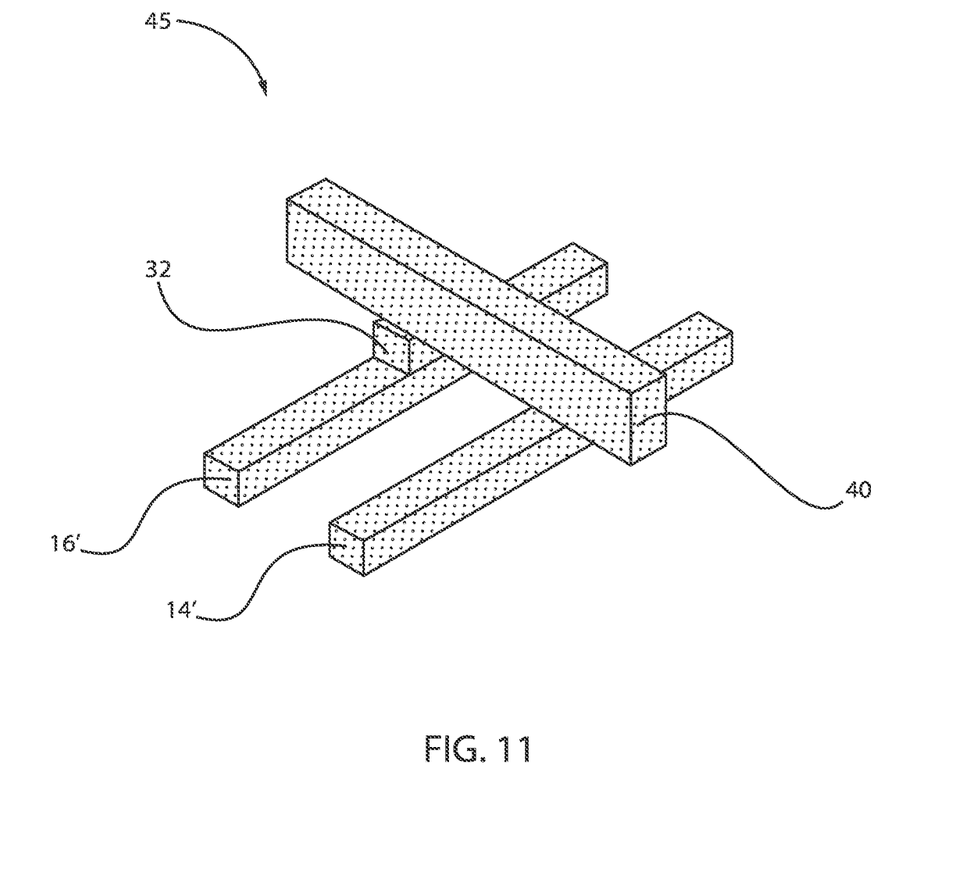
FIG. 11 is a perspective view of the semiconductor structure of FIG. 10 illustrating a single via automatically aligned to conductive lines both above and below the via, in accordance with an embodiment of the present invention.

FIG. 11 is a perspective view of the semiconductor structure of FIG. 10 illustrating a single via automatically aligned to conductive lines both above and below the via, in accordance with an embodiment of the present invention.

Structure 45 illustrates the structure of FIG. 10 where the dielectric materials 12, 24, 34 are removed to illustrate the single via 32. Thus, the single via 32 automatically aligns to the conductive material strip 40 above and the conductive lines 14', 16' below the single via 32. Conventional interconnect integration schemes have a via align to metal lines above or below the via. As a result, the overlay error between the via and one line above or one line below can cause yield and reliability issues. In contrast, the structure 45 illustrates a patterning integration scheme where a via automatically aligns to the metal lines above and below the via. As a result, there is no overlay error between the via and the line above and the line below. This configuration helps achieve better chip yield and reliability.

Structure 45 depicts the via 32 intersecting the conductive material strip 40 above and the conductive lines 14', 16' below the via 32. Therefore, a top line pattern is employed to form via 32 between a top metal line 40 and bottom metal lines 14', 16' such that the via 32 can be fully aligned to both the top metal line 40 and bottom metal lines 14', 16'. The method employs a line pattern to define both top line and via between the top lines and the bottom lines. The structure employs a pattern top line and via in a process flow such that the via 32 aligns to both the conductive material strip 40 above and the metal lines 14', 16' below the via 32. Stated differently, the single via is formed first with the bottom line by using a top line pattern, and then metallization to the line occurs. Thus, the exemplary embodiments employ a top via scheme. Additionally, the single via dimension automatically matches the top and bottom line dimensions.

In summary, the exemplary embodiments of the present invention introduce a method and structure for forming self-aligned vias by employing a top level line pattern. The via level litho process is skipped in the integration scheme. The self-aligned via is constructed by using a sacrificial line pattern to form the via, and then convert the sacrificial line pattern into a metal line pattern. As a result, the single via is fully aligned to the top level and bottom level metal lines. Additionally, the exemplary embodiments of the present invention eliminate line-to-via litho alignment errors, minimize contact resistance, maximize via current, and improve via reliability.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming self-aligned vias by employing a top level line pattern (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming self-aligned vias by employing a top level line pattern, the method comprising:
forming first conductive lines in parallel to each other within a first dielectric material;
recessing at least one conductive line of the first conductive lines to create a first opening and to define a first set of recessed first conductive lines and a second set of non-recessed first conductive lines;
filling the first opening with a second dielectric material such that top surfaces of the second set of non-recessed first conductive lines remain exposed;
forming a sacrificial block perpendicular to the second set of non-recessed first conductive lines such that the top surfaces of the second set of non-recessed first conductive lines directly contact the sacrificial block;
forming a single via directly underneath the sacrificial block by recessing the second set of non-recessed first conductive lines;
removing the sacrificial block to create a second opening extending over all of the first set of recessed first conductive lines; and
filling the second opening with a conductive material to define a second conductive line such that the single via aligns to both the first conductive lines and the second conductive line, wherein a width of the single via is equal to a width of the conductive material.

2. The method of claim 1, further comprising depositing a block mask before recessing the one conductive line.

3. The method of claim 1, wherein the first and second dielectric materials are constructed from a same material.

4. The method of claim 1, wherein the second set of non-recessed first conductive lines are perpendicular to the second conductive line.

5. The method of claim 1, wherein a dimension of the single via automatically matches dimensions for the non-recessed first conductive line and the second conductive line.

6. The method of claim 1, wherein the single via is formed before constructing the second conductive line.

7. The method of claim 1, wherein a third dielectric material is deposited adjacent the sacrificial block before forming the second opening.

8. The method of claim 7, wherein the second opening extends along an entire length of the third dielectric material.

9. The method of claim 8, wherein the second opening is perpendicular to the second set of non-recessed first conductive lines.

10. A method for forming self-aligned vias by employing a top level line pattern, the method comprising:
forming first conductive lines in parallel to each other within a first dielectric material;
depositing a block mask over one of the first conductive lines;
recessing at least one first conductive line to create a first gap and to define a first set of recessed first conductive lines and a second set of non-recessed first conductive lines;
removing the block mask;
filling the first gap with a second dielectric material such that top surfaces of the second set of non-recessed first conductive lines remain exposed;
depositing a sacrificial block perpendicular to the first conductive lines such that the top surfaces of the second set of non-recessed first conductive lines directly contact the sacrificial block;

recessing the second set of non-recessed first conductive lines to create a second gap and a single via, wherein the second gap extends over all of the first set of recessed first conductive lines;

filling the second gap with a third dielectric material;

removing the sacrificial block to define a third gap; and filling the third gap with a conductive material to define a second conductive line such that the single via aligns to both the first conductive lines and the second conductive line, wherein a width of the single via is equal to a width of the conductive material.

11. The method of claim 10, wherein the sacrificial block is perpendicular to the first conductive lines.

12. The method of claim 10, wherein the first, second, and third dielectric materials are constructed from a same material.

13. The method of claim 10, wherein the first set of recessed first conductive lines are perpendicular to the second conductive line.

14. The method of claim 10, wherein a dimension of the single via automatically matches dimensions for the first conductive lines and the second conductive line.

15. The method of claim 10, wherein the single via is formed before constructing the second conductive line.

16. The method of claim 10, wherein the block mask directly contacts an entire top surface of one of the first conductive lines.

* * * * *